(12) United States Patent
Liu et al.

(10) Patent No.: US 7,242,071 B1
(45) Date of Patent: Jul. 10, 2007

(54) SEMICONDUCTOR STRUCTURE

(75) Inventors: Xuefeng Liu, South Burlington, VT (US); Robert M. Rassel, Colchester, VT (US); Steven H. Voldman, South Burlington, VT (US)

(73) Assignee: International Business Machine Corporation, Armonk, NY (US)

( * ) Notice: Subject to any disclaimer, the term of this patent is extended or adjusted under 35 U.S.C. 154(b) by 0 days.

(21) Appl. No.: 11/382,720

(22) Filed: Jul. 6, 2006

(51) Int. Cl.
*H01L 29/00* (2006.01)

(52) U.S. Cl. .............. 257/510; 257/511; 257/506; 257/E21.371

(58) Field of Classification Search ............ 257/526, 257/510, 520, 587–588; 438/430–432, 664–367
See application file for complete search history.

(56) References Cited

U.S. PATENT DOCUMENTS

| | | | |
|---|---|---|---|
| 4,005,469 A | 1/1977 | Chang et al. | |
| 4,159,915 A * | 7/1979 | Anantha et al. | 438/326 |
| 4,644,383 A | 2/1987 | Akcasu | |
| 5,422,501 A | 6/1995 | Bayraktaroglu | |
| 6,011,297 A * | 1/2000 | Rynne | 257/526 |
| 6,656,815 B2 | 12/2003 | Coolbaugh et al. | |
| 6,891,251 B2 | 5/2005 | Coolbaugh et al. | |
| 6,927,452 B2 * | 8/2005 | Shin et al. | 257/335 |
| 7,001,806 B2 | 2/2006 | Tilke et al. | |
| 2001/0042867 A1 | 11/2001 | Furuhata | |
| 2002/0084506 A1 | 7/2002 | Voldman et al. | |
| 2003/0094673 A1 | 5/2003 | Dunn et al. | |
| 2004/0227210 A1 | 11/2004 | Tilke et al. | |
| 2005/0207077 A1 * | 9/2005 | Xu et al. | 361/56 |

* cited by examiner

*Primary Examiner*—Dung A Le
(74) *Attorney, Agent, or Firm*—Anthony J. Canale; Greenblum & Bernstein, P.L.C.

(57) ABSTRACT

A structure comprises a deep sub-collector buried in a first epitaxial layer and a near sub-collector buried in a second epitaxial layer. The structure further comprises a deep trench isolation structure isolating a region which is substantially above the deep sub-collector, a reach-through structure in contact with the near sub-collector, and a reach-through structure in contact with the deep sub-collector to provide a low-resistance shunt, which prevents COMS latch-up of a device. The method includes forming a merged triple well double epitaxy/double sub-collector structure.

24 Claims, 8 Drawing Sheets

SEMICONDUCTOR STRUCTURE

FIELD OF THE INVENTION

The invention relates generally to a semiconductor structure and method of manufacturing and more particularly to a merged triple well double epitaxy/double sub-collector structure.

BACKGROUND OF THE INVENTION

CMOS (complementary metal oxide semiconductor) circuits are widely used in many applications such as, for example, battery-powered devices such as portable computers and cellular telephones. CMOS is a very effective device configuration for implementation of digital functions due to very low power consumption and dissipation as well minimization of the current in the "off" state.

In implementation, CMOS semiconductors comprise both n-channel and p-channel MOS field effect transistors (MOSFETs), i.e., use both n-channel MOSFETs, and p-channel MOSFETs. However, in CMOS structures, parasitic current paths exist associated by so-called parasitic bipolar transistors, which, under normal conditions, are not activated. CMOS latch-up can occur when the parasitic pnp and npn bipolar transistors are activated. Activation can be initiated by voltage or current perturbations, or ionizing radiation. CMOS latch-up occurs when regenerative feedback occurs between the npn and pnp parasitic bipolar transistors.

Various CMOS designs have been conceived to prevent CMOS latch-up. For example, it is known to increase the spacing between devices which, in turn, increases the effective base width of the parasitic transistors. As should be understood, with such a design, the bipolar current gain will decrease as the base width increases. Thus, in such a design, as the N-diffusion moves away from the N-well, or the P-diffusion moves away from the N-well edge, or vertically, CMOS latch-up is less likely to occur.

Another approach to reducing CMOS latch-up sensitivity has been to increase doping concentrations. For example, by increasing the doping concentrations, the minority carrier lifetime is decreased; when the doping is in the base region, the bipolar current gain decreases. In a further design, isolation structures, such as shallow trench isolation (STI), have been provided to reduce the CMOS latch-up sensitivity.

As technology scales, however, the spacing between the P+ diffusion and the N-well and the N+ diffusion and N-well spacing become smaller. Thus, due to the scaling, previous techniques to prevent CMOS latch-up are becoming more problematic. For example, it is more difficult to increase the doping in specific areas, since the increase in dopants will increase the out-diffusion of the dopants which, in turn, increases the capacitance of the device (at the junctions) impacting circuit performance. Also, as for shallow trench isolation structures, P+ to N+ space is scaled to maintain the aspect ratio of the isolation; hence the shallow isolation structure becomes shallower every generation, not deeper.

SUMMARY OF THE INVENTION

In a first aspect of the invention, a structure comprises a "deep sub-collector" (DS) located in a first epitaxial layer and a "near sub-collector" (NS) located in a second epitaxial layer. The structure further comprises a deep trench (DT) isolation structure isolating a region which is substantially above the deep sub-collector, a reach-through structure in contact with the near sub-collector, and a reach-through structure in contact with the deep sub-collector to provide a low-resistance shunt, which prevents latch-up of a device.

In a second aspect of the invention, a multi-circuit structure comprises a deep sub-collector formed in a first region under a first device and a near sub-collector formed in a second region under a second device, the near sub-collector being located closer to the second device than the deep-sub-collector is to the first device. The structure further comprises at least one low-resistance path electrically connecting the first device and the deep sub-collector and a deep trench isolation structure isolating a region substantially above the deep sub-collector.

In another aspect of the invention, a method of forming a structure comprises forming a first epitaxial layer on a substrate and a first sub-collector in the first epitaxial layer. The method further comprises forming a second epitaxial layer on the first epitaxial layer and a second sub-collector in the second epitaxial layer. The method further comprises forming a device over the first sub-collector, forming at least one deep trench isolation structure in order to electrically isolate the device, and forming at least one reach-through in the first and second epitaxial layers which is electrically connected to the first sub-collector.

The invention also provides for a structure comprising a deep sub-collector located in a first epitaxial layer, a near sub-collector located in a second epitaxial layer, a deep trench isolation structure isolating a region which is substantially above the deep sub-collector, a reach-through structure in contact with the near sub-collector, and a reach-through structure in contact with the deep sub-collector to provide a low-resistance shunt, which prevents latch-up of a device.

A P-well region may be formed in the first epitaxial layer above the deep sub-collector, and the P-well region is isolated by the deep sub-collector and the reach-through structure in contact with the deep sub-collector. The reach-through structure in contact with the deep sub-collector may extend through a P− region formed in the first epitaxial layer. The near sub-collector may be in the region substantially above the deep sub-collector. The near sub-collector may be in a region substantially outside the region above the deep sub-collector. The near sub-collector may be located under a device in a complimentary metal oxide semiconductor portion of the structure. The near sub-collector may be formed substantially in parallel with the deep sub-collector within a complimentary metal oxide semiconductor portion of the structure to form parallel sub-collector low-resistance paths underneath the structure. The reach-through structure in contact with the deep sub-collector may be a stacked structure extending through at least two epitaxial layers to the deep sub-collector. The deep trench isolation structure may form a three-dimensional ring around the P-well.

The invention also provides for a multi-circuit structure comprising a deep sub-collector formed in a first region under a first device, a near sub-collector formed in a second region under a second device, the near sub-collector being located closer to the second device than the deep-sub-collector is to the first device, at least one low-resistance path electrically connecting the first device and the deep sub-collector, and a deep trench isolation structure isolating a region substantially above the deep sub-collector.

The deep sub-collector may be buried under at least one epitaxial layer. The first device may be a complementary metal oxide semiconductor device. The at least one low-resistance path may be a reach-through structure providing a lateral or vertical low-resistance path. The at least one reach-through may extend on sides of the first device and is configured to prevent latch-up conditions. The at least one reach-through may be a stacked structure formed from a second reach-through stacked on a first reach-through. The at least one reach-through may extend at least partially through at least two epitaxial layers to the deep sub-collector. The structure may further comprise shallow isolation regions formed in the second epitaxial layer, the at least one reach-through contacting at least one of the shallow isolation regions. The deep trench isolation structure may form a three-dimensional ring which isolates the first device.

DETAILED DESCRIPTION OF EMBODIMENTS OF THE INVENTION

The invention relates to a semiconductor structure and a method of manufacturing. In embodiments, the invention more specifically relates to a method of manufacture forming a double epitaxy/double sub-collector triple-well structure. In embodiments, the processing steps implemented by the invention minimize P+/N+ space, while preventing CMOS latch-up, e.g., prevents the structure going from a low current/high voltage state to a high current/low voltage state. The invention may be suitable for CMOS, RF CMOS, BiCMOS, RF BiCMOS, RF BiCMOS Silicon Germanium (SiGe), RF BiCMOS Silicon Germanium Carbon (SiGeC), bipolar SOI, homo-junction, and heterojunction bipolar transistor (HBT) devices, to name a few. (U.S. application Ser. No. 11/163,882 is herein incorporated by reference in its entirety.)

Figure 1:
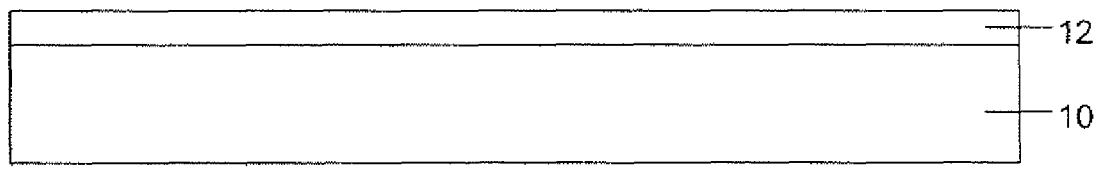
FIGS. 1–8 show process steps for forming the final structure shown in FIG. 14, in accordance with the invention.

Referring to FIG. 1, a starting structure is shown, which includes a substrate 10. In one embodiment, the substrate may be silicon, or germanium although other materials and/or substrates may equally be used such as, for example, SOI. In embodiments, a pad oxide 12 may be formed over the substrate 10.

Figure 2:
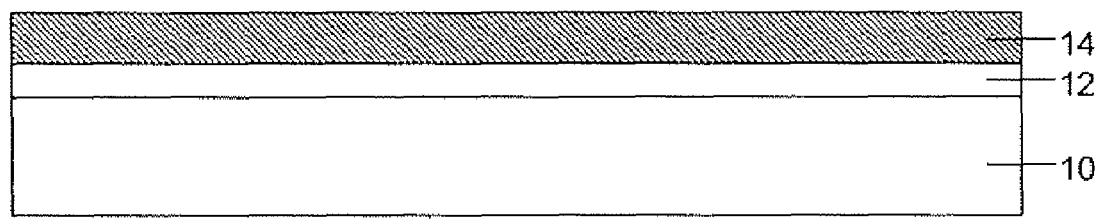
Figure 3:
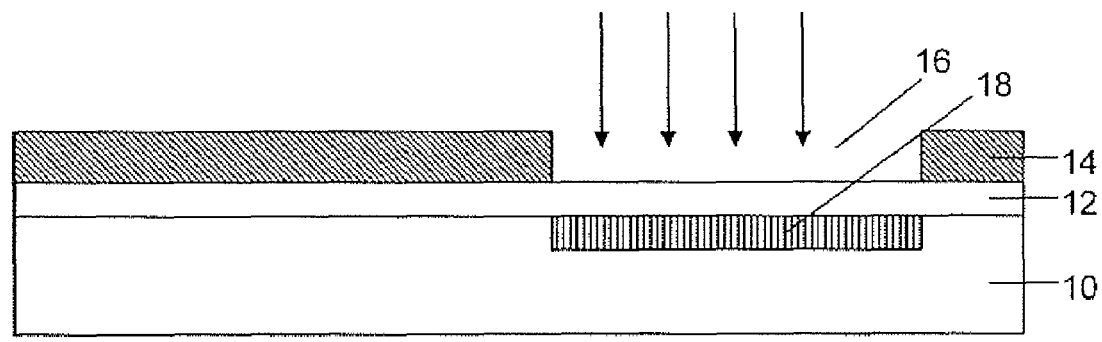

In FIG. 2, a first photo-resist 14 is formed over the pad oxide 12. In FIG. 3, the photo-resist 14 is exposed in order to open a first window 16 to the underlying layer(s). The first window 16 is formed in a well known semiconductor photo-resist process, such as using spin on glass techniques. As such, a description of the photo-resist process is not necessary for a person of ordinary skill in the art to practice this particular step.

In FIG. 3, after the first window 16 is opened in the photo-resist 14, the method of fabrication continues by doping, e.g., ion implanting, the exposed underlying layer(s) with well known dopants to form a "deep sub-collector" (DS) 18. A deep sub-collector is, for example, a collector that is formed relatively further away from the top surface of the structure. In one illustrative embodiment, the dopant element for a sub-collector may include, for example, Arsenic (As), Antimony (Sb), Phosphorous (P), or other N-doped elements. In one implementation, doping occurs at a common energy level and dosage, well known to those of skill in the art (e.g., in the energy range of approximately 20–60 KeV and dose of $10^{14}$ to $10^{16}$ atoms/cm$^2$). The ion implantation process forms the deep sub-collector 18, e.g., deep N+, extending into the underlying layer(s).

The deep sub-collector (DS) 18 will serve as an isolating structure (and parallel resistor with a near sub-collector) to prevent latch-up. The deep sub-collector 18 may, for example, form a PIN diode cathode, or high breakdown npn HBT sub-collector in the final structures. The deep sub-collector 18 may also be used in a final structure as, for example, a varactor diode, or Schottky diode, to name a few. The deep sub-collector 18 may be formed by doping methods known to those of skill in the art. The doping concentration of the deep sub-collector 18 is high, for example from $1 \times 10^{18}$ atoms/cm$^3$ to $1 \times 10^{21}$ atoms/cm$^3$.

Figure 4:
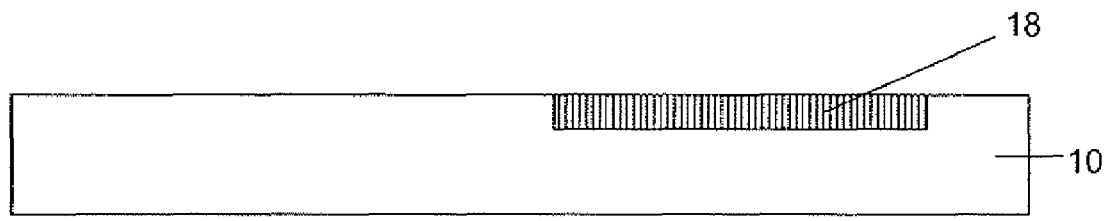

Referring to FIG. 4, the first photo-resist layer 14 is stripped using conventional processes. In this processing step, the pad oxide 12 may also be stripped, e.g., etched, using conventional processes. In embodiments, the stripping process removes any implant damage that occurred during the doping process described above.

Figure 5:
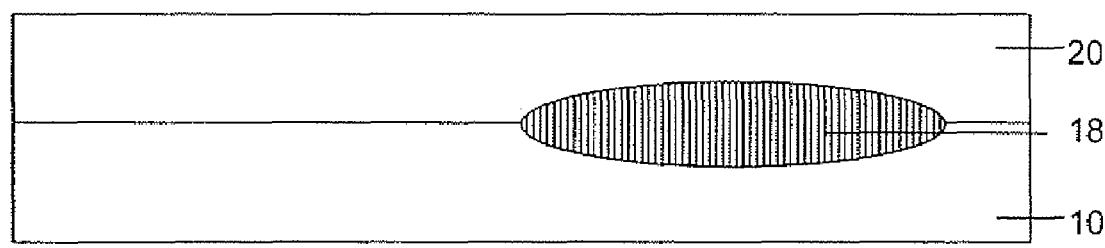

In FIG. 5, a first epitaxial (epi) layer 20 is formed over the substrate 10. It should be noted that this first epi layer 20 forms a P− region. In embodiments, the deep sub-collector 18 grows into the first epi layer 20, and the first epi layer 20 may form a P− layer. The first epi layer 20 may range from approximately 0.25 to 5 µm which effectively increases the distance of the deep sub-collector 18 from a surface of the device. In embodiments, increasing the depth of the deep sub-collector from the surface, it is possible to decrease the vertical npn gain of a traditional triple-well process. Thus, even without a "near sub-collector" (NS) (as discussed below) the present invention provides an advantage over known triple-well processes.

Figure 6:
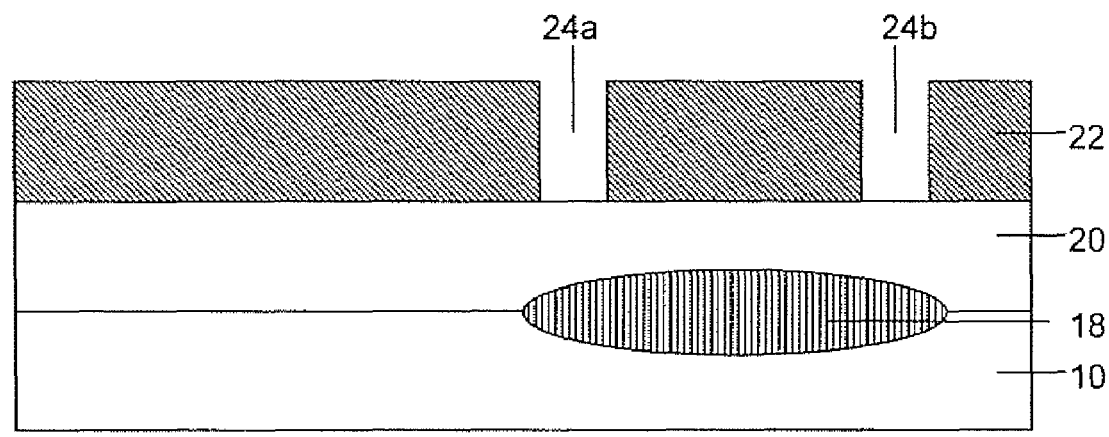

In FIG. 6, a second photo-resist layer 22 is formed over the first epi layer 20. In one embodiment, a pad oxide layer may be formed over the first epi layer 20, prior to the formation of the second photo-resist layer 22. In a conventional fabrication process, the second photo-resist layer 22 is exposed to light to open second windows 24a and 24b.

Figure 7:
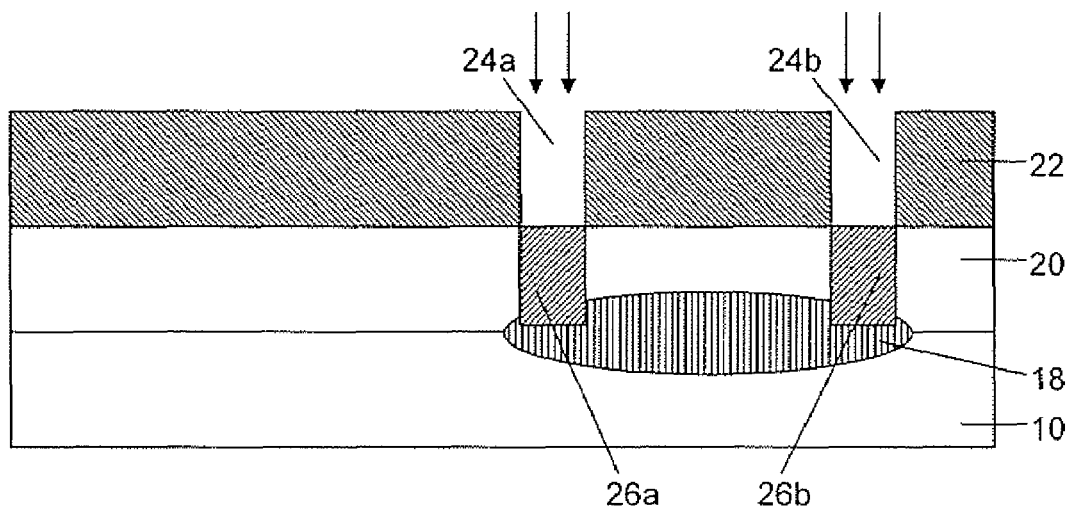

In FIG. 7, deep reach-throughs 26a and 26b are formed by an ion implantation process using dopants such as, for example, Arsenic (As), Antimony (Sb), Phosphorous (P), or other N–doped element. The deep reach-throughs 26a and 26b work as conducting paths or low electrical and thermal resistance connections to the deep sub-collector 18. In embodiments, the first epitaxial layer 20, deep sub-collector 18, and deep reach-throughs 26a and 26b form an isolated P-well region.

The second photo-resist layer 22 (and, in embodiments, the pad oxide layer) may then be stripped using conventional processes. Again, any damage from the ion implanting process may be repaired during this stripping process.

Figure 8:
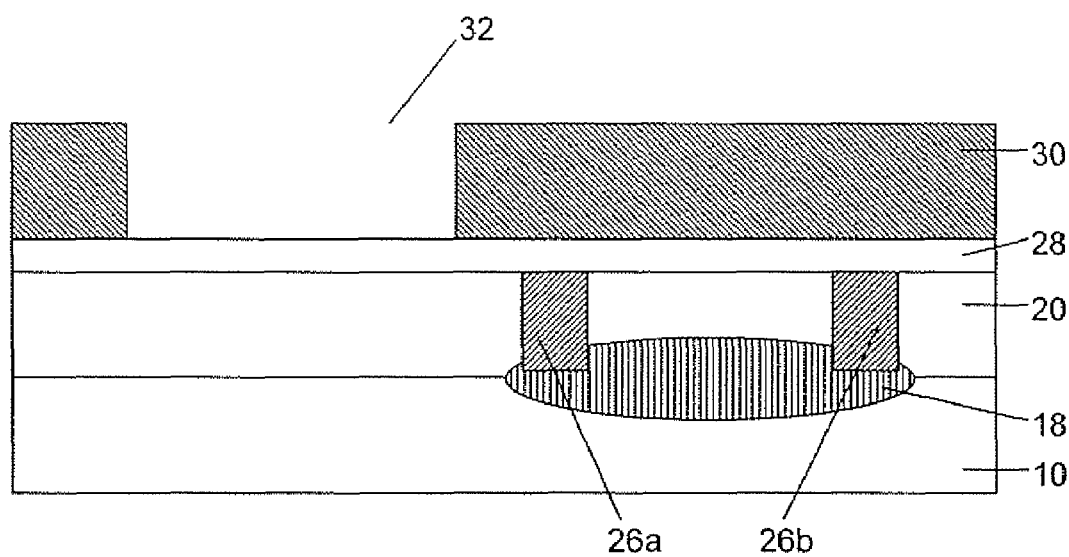

In FIG. 8, an optional pad oxide layer 28 and a photo-resist layer 30 are formed over the first epi layer 20, in any conventional manner. For example, as with the previous steps, the optional pad oxide layer 28 may be thermally grown or deposited. In conventional semiconductor processing steps, a window 32 is opened in the photo-resist layer 30, in a region which is not over the deep sub-collector 18.

Figure 9:
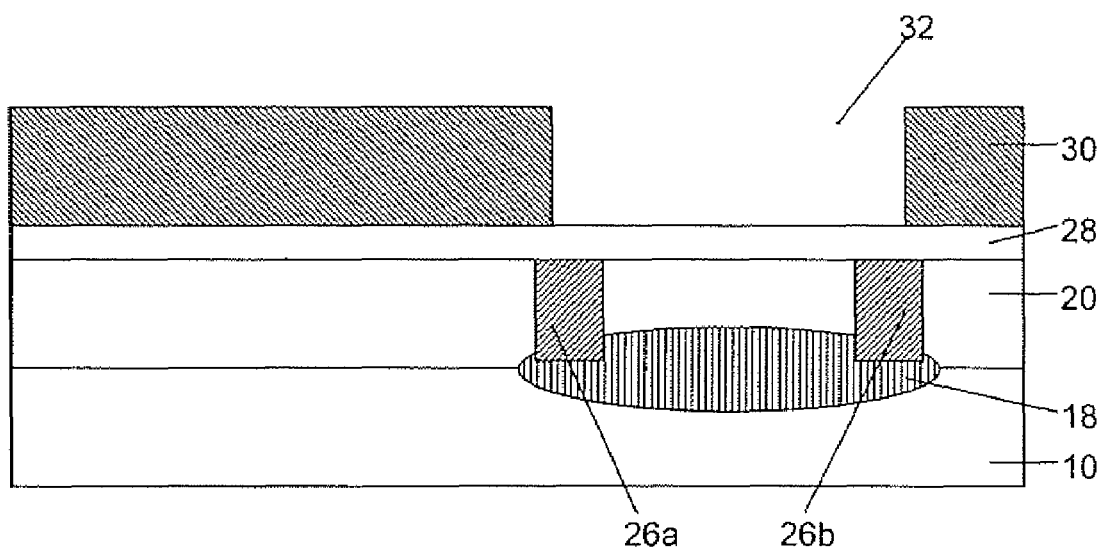
FIG. 9 shows an alternate process step for forming an alternate embodiment of the invention.

Alternatively, as shown in FIG. 9, a window 32 may be formed in a region which is over the deep sub-collector 18. If this alternative step is not taken, then the remaining steps are taken as described below. If this alternative step is taken, then the remaining steps are taken in a process parallel to that described below, with the modification that the remaining elements of the structure, as described below, are formed in a region above the deep sub-collector 18. In the alternative embodiment of FIG. 9, a near sub-collector will be will be formed in parallel with the deep sub-collector to form parallel sub-collector low-resistance paths underneath the structure. The near sub-collector will be used to lower the parasitic vertical current gain of the vertical parasitic pnp.

Figure 10:
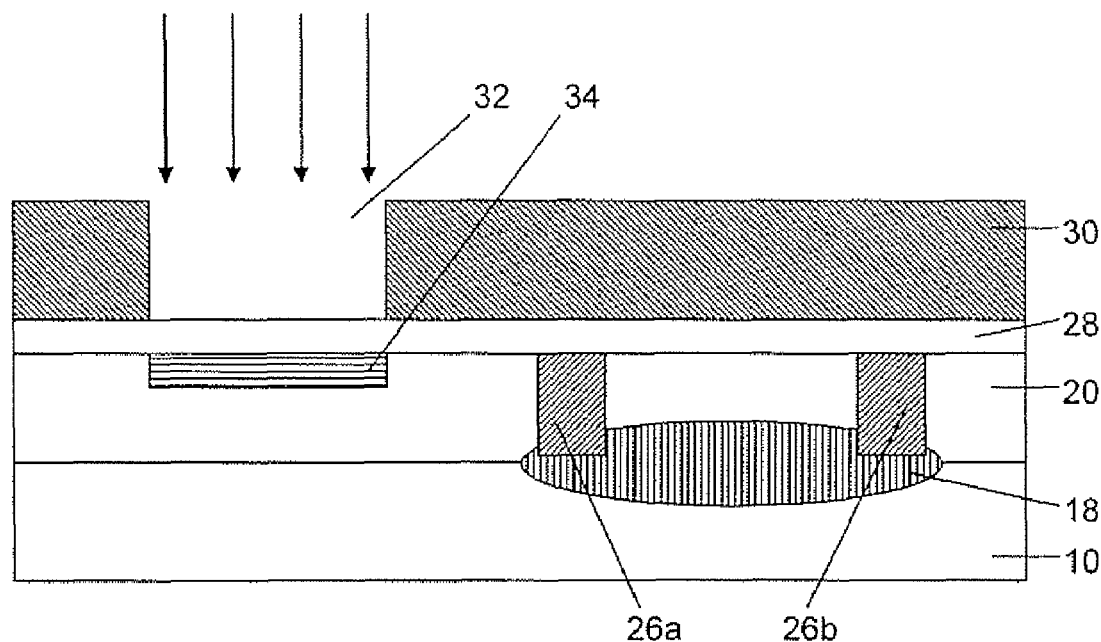
FIGS. 10–13 show additional process steps for forming the final structure shown in FIG. 14, in accordance with the invention.

As shown in FIG. 10, a near sub-collector (NS) 34 is formed within the first epi layer 20 by a conventional ion implantation process using dopants such as, for example, Arsenic (As), Antimony (Sb), Phosphorous (P), or other N-doped elements to form. A near sub-collector is, for example, a collector that is formed relatively close to the top surface of the structure, as compared to the depth of the deep sub-collector. The near sub-collector 34 may be formed by doping methods known to those of skill in the art. The doping concentration of the near sub-collector 34 is high, for example from $1 \times 10^{18}$ atoms/cm$^3$ to $1 \times 10^{21}$ atoms/cm$^3$.

In embodiments, there is a separation between the near sub-collector 34 and the deep sub-collector 18, even in the alternative embodiment shown in FIG. 9. The near sub-collector 34 and the deep sub-collector 18 are, though, electrically connected or shorted, in one embodiment, for example, by the deep reach-throughs 26a and 26b such that the deep reach-throughs 26a and 26b work as conducting paths or low-resistance connections between the near sub-collector 34 and the deep sub-collector 18 (e.g., the deep reach-throughs 26a and 26b provide a lateral reduction of the lateral bi-polar gain).

The sheet resistance of the near sub-collector 34 and the deep sub-collector 18 is, in embodiments, 1 to 100 ohms/square. It should be recognized, though, that the sheet resistance of the near sub-collector 34 and the deep sub-collector 18 can range from approximately 1 to 300 ohms/square.

Still referring to FIG. 10, the photo-resist layer 30 is stripped using a conventional process, with the pad oxide 28 being stripped thereafter. In one embodiment, this stripping process removes any implant damage that occurred during the doping process described above.

Figure 11:
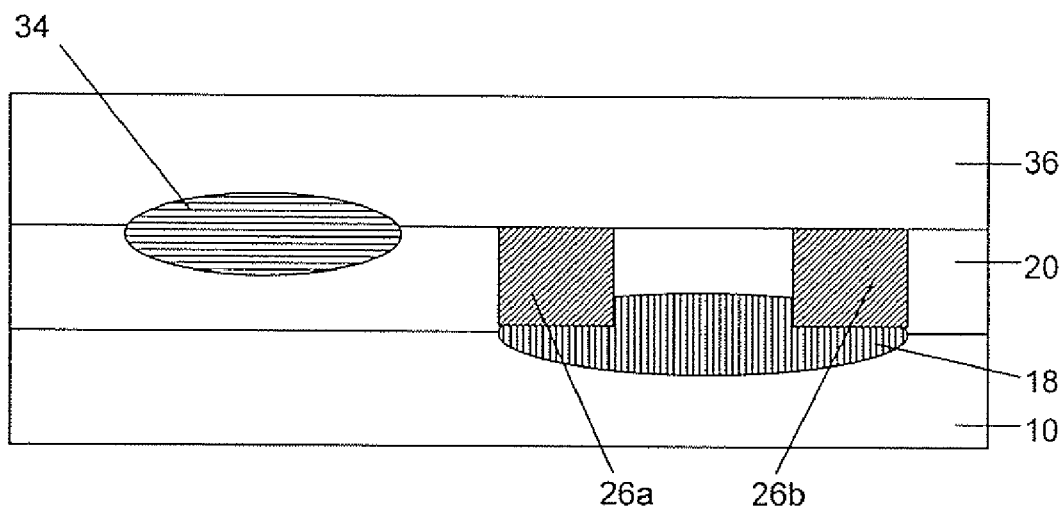

In FIG. 11, in accordance with a dual epi process of the invention, a second epi layer 36 is formed over the structure, forming stacked epitaxial layers. In particular, the second epi layer 36 is formed over the near sub-collector 34. In embodiments, the near sub-collector 34 will grow up into the second epi layer 36. Also, the second epi layer 36 can be fabricated to have a wide thickness flexibility to provide tunability of the device. In embodiments of the invention, the second epi layer 36 is approximately in the range of 0.25 to 5 µm, which may be in the same range as the thickness of the first epi layer 20. In any scenario, the tunability of the second epi layer 36 provides advantages over known fabrication methods. In embodiments, the second epi layer 36 effectively increases the distance between the deep sub-collector and the surface of the structure, thus decreasing the vertical npn gain of a traditional triple-well process.

Figure 12:
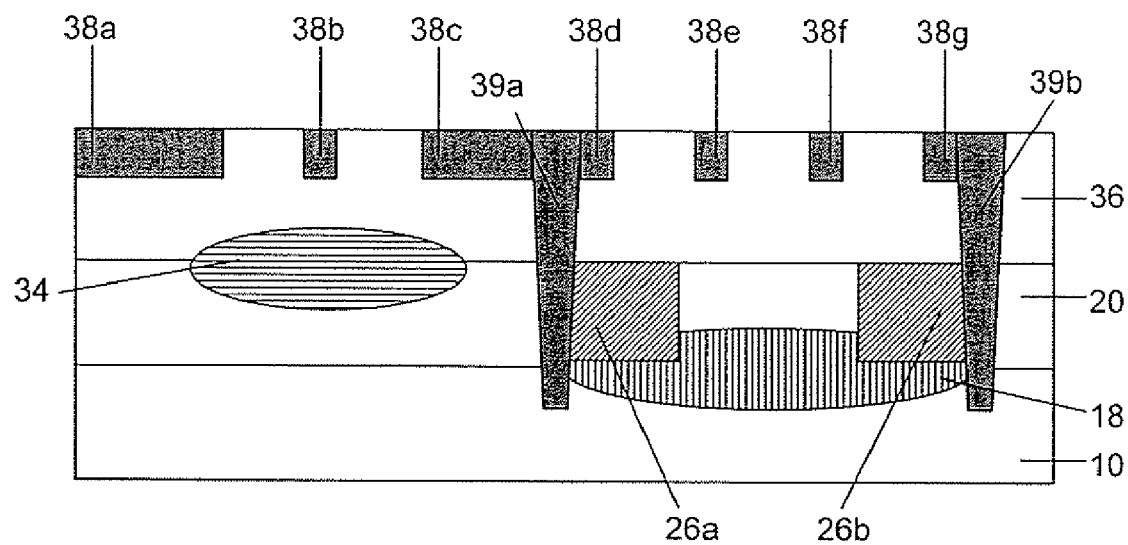

In FIG. 12, shallow trench isolation (STI) structures 38a–38g and deep trench (DT) isolation structures 39a and 39b are formed by conventional processes. It should be understood that the deep trench isolation structures 39a and 39b may include a dielectric sidewall material and a fill material in the dielectric, e.g., polysilicon, BPSG, or PSG. The deep trench isolation structures 39a and 39b may be constructed either before or after the shallow trench isolation structures 38a–38g. These structures are formed for device isolation purposes in the P-wells and N-wells, as is shown, for example, in FIGS. 13–15. Alternatively, isolation structures may comprise local oxidation of silicon ("LOCOS") or recessed oxide (ROX) structures. The deep trench isolation (DT) structures 39a and 39b are integrated with the near reach-throughs 40b and 40c, as shown in FIG. 13.

Figure 13:
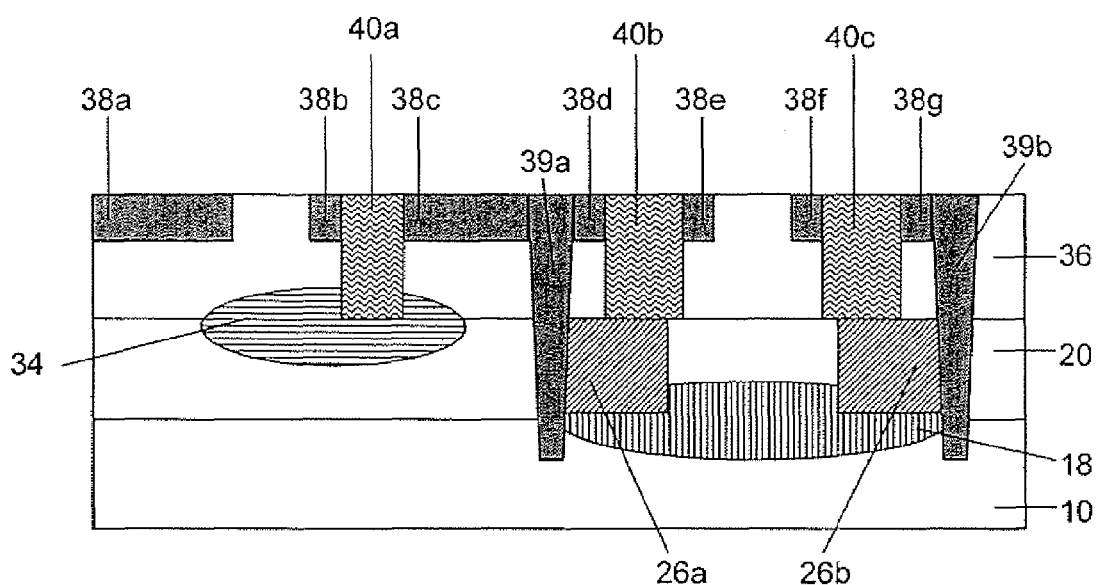

In FIG. 13, near reach-throughs (or sidewall implants) 40a–40c are formed in the second epi layer 36, forming stacked reach-throughs. The near reach-throughs 40b and 40c may or may not abut the deep trench isolation structures 39a and 39b. The near reach-throughs 40a–40c can be formed in any conventional manner, as described with reference to the deep reach-throughs 26a and 26b. For example, the near reach-throughs 40a–40c may be formed by ion implantation with species such as dopants such as, for example, Phosphorous (P), or other N-doped elements, using known implant energies. In embodiments, near reach-through 40a is integrated with the near sub-collector 34 to provide a conducting path to link with the near sub-collector 34, and near reach-throughs 40b and 40c are stacked on the deep reach-throughs 26a and 26c in a manner to provide a low resistance path to electrically contact with the deep sub-collector 18. The near reach-throughs 40b and 40c act as a border for the N-well region (e.g., FIG. 14) to eliminate the lateral bipolar gain.

Figure 14:
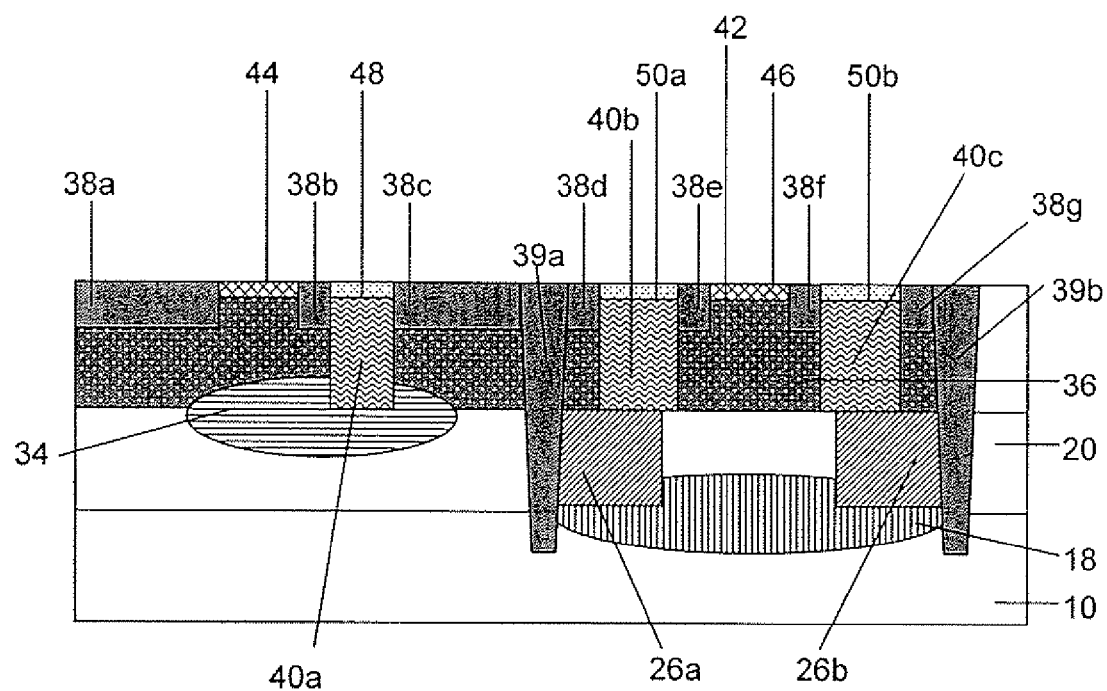
FIG. 14 shows a final structure in accordance with the invention.

FIG. 14 shows a final structure in accordance with the invention. In this embodiment, an N-well implant 42 is formed in the second epi layer 36. Additionally, P+ regions 44 and 46, and N+ regions 48, 50a and 50b are grown in selective areas on the structure. The P+ regions 44 and 46 may be formed, for example, through implantation or diffusion. In embodiments, for example, a P+ film 46 is grown selectively over the second epi layer 36 in a conventional epitaxial manner, such as LTE, LPCVD, CVD, etc. The P+ region 44 may be, for example, a transistor. The P+ region 46 can be any P-type device such as, for example, a P+ diode, a P-channel MOSFET, a P—N diode, P+ resistor, P-MOS capacitor, or base region of a NPN transistor etc. It should be understood by one of skill in the art that, in embodiments wherein the P+ region 46 is a film, this region will be above the surface of the second epi layer. Such a P-type film may be, for example, Silicon, Silicon Germanium, Silicon Germanium Carbon, or Polysilicon. For example, the P+ region 46 may be a P region of a heterojunction bipolar transistor (HBT), a Silicon Germanium Carbon HBT, a resistor, a Polysilicon resistor, or other known devices. The N+ regions 48, 50a and 50b may be any N-type devices such as, for example, an N-well diode, an N-channel MOSFET, an N-resistor, etc. The details of other processes, e.g., forming passive components, interconnect metallization, etc., are not shown here but should be known to those of skill in the art.

Additionally, as should be understood by those of skill in the art, the structure shown herein is a triple well structure, i.e., having an isolated P-well region, an N-well region, and chip substrate. (The P-well located on top of a P− epi region is an isolated well). Also, the P+ region serves as a contact to the P-well P− region, which is a substrate contact. And, the N+ diffusion is the N-well contact, which is contacting the near reach-through 40c, deep reach-through 26b, the deep sub-collector 18, and the N-well 42. Thus, this arrangement is serving as a low-resistance contact to the entire structure. In combination, the near reach-through, near sub-collector, deep reach-through, far sub-collector, and deep trench (DT) make both of the devices shown in FIGS. 14 and 15 not only latch-up resistant, but will prevent injection from sources such as noise.

Figure 15:
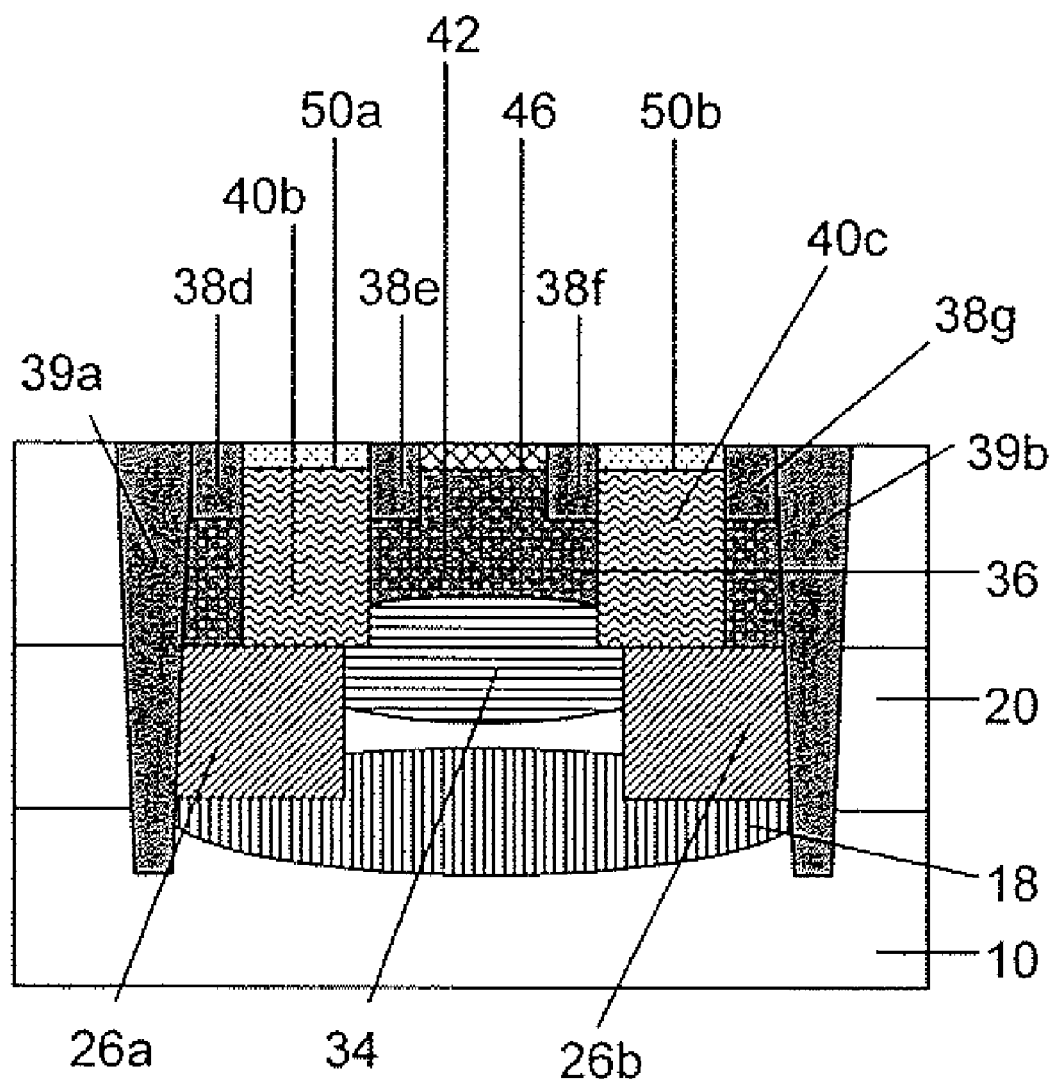
FIG. 15 shows an alternate final structure in accordance with the invention.

Further, it will be understood by those of skill in the art, that the width of the base is the width of the N-well plus the width of the near sub-collector. Effectively, as the base width increases, the vertical bipolar current gain of the pnp decreases. And, the doping concentration of the near sub-collector is high, which also increases the recombination of holes in the N-well near sub-collector region, preventing holes from reaching the lower junction formed between the near sub-collector and the first epi region. That is, holes ejected from the P+ PFET P-diffusion resistors do not survive diffusion through the N-well and near sub-collector because of the short recombination time. Any carriers ejected in the first epi region between the near sub-collector and the deep sub-collector also do not reach the substrate, because this region, in the embodiment shown in FIG. 15, is electrically isolated by the deep reach-throughs.

The near sub-collector and the deep sub-collector laterally serve as low-resistance electrical and thermal shunts, so that there is no voltage or thermal drop through this whole physical region, which reduces the electrical and thermal shunt resistance. This low-resistance lateral shunt prevents the forward biasing of the P+ N-well junction.

Although not shown in the figures, it should be understood by one of skill in the art that there would be an N+ diffusion region and a P+ contact located outside of the deep trench isolation structures. As should further be understood in view of the above discussion and accompanying structures, the right-side region of the structure is a P+, N+, P−, N+. In this manner, a vertical pnpn is formed, where the first N-region and the second N-region are shorted together by the near and deep reach-throughs, and accordingly the device never turns on. As to lateral current flow of the parasitic pnp, such flow is forced through the near reach-through, which will eliminate the lateral device current gain between the P-well and N-well, which, in turn, improves the reduction of the lateral bipolar current gain of the pnp. Additionally, although not shown in the figures, it should be understood by those skilled in the art that a mask may be employed to separate the N-well and the P-well if necessary.

In embodiments a pnp is created when the near sub-collector and deep sub-collector merge, e.g., a P+, N-well, P− device is created. The combined low sheet resistance of the two sub-collectors acts as a lateral thermal and electrical shunt. Additionally, the near reach-throughs and deep trench regions together eliminate the lateral pnp device which would have formed between the P+ film, the N-well, and the second epi region. The stacked reach-through structure when placed on the edges of the N-well, near sub-collector, and deep sub-collector structures reduces the bipolar current gain of the lateral pnp devices. Hence the utility of the stacked reach-through structure is a low resistance electrical and thermal shunt and reduction of the lateral bipolar parasitic current gain.

In embodiments, the deep trench isolation structures perform a function comparable to a Faraday cage, electrically isolating the region above the deep sub-collector. It should be noted that in alternative embodiments, although shown in the figures in only two dimensions, the deep reach-throughs, the near reach-throughs, and the deep trench isolation structures may form three-dimensional rings around the region above the deep sub-collector. In the case of FIG. 14, the near sub-collector would be located outside the ring; whereas in FIG. 15, the near sub-collector would be located inside the ring.

FIG. 15 shows an alternate final structure in accordance with the invention using the embodiment shown in FIG. 9 with the remaining steps taken in a process parallel to that described above, e.g., the remaining elements of the structure are formed in a region above the deep sub-collector 18. In embodiments, this device might be preferred over that shown in FIG. 14 in order to maintain the CMOS characteristics without impacting the device, that is, where it is preferred not to locate the near sub-collector close to the device (e.g., when the device is a Schottky diode, which would impact the capacitance).

In the alternative embodiment of FIG. 15, the near sub-collector serves two roles. First, the near sub-collector increases the width of the bipolar base, and consequently decreases the pnp bipolar vertical current gain. Second, because the doping concentration of the near sub-collector is higher than that of the N-well, the near sub-collector increases the recombination of holes in the N-well near sub-collector region, which prevents holes from reaching the lower junction between the near sub-collector and the second epi region. Also, in the alternative embodiment of FIG. 15, the deep sub-collector acts as a shield to prevent any vertical injection from reaching the substrate. The deep reach-throughs short the near and deep sub-collectors, maintaining the same electrical potential, and the deep trench isolation structures prevent any lateral injection from reaching the epi layers.

The device of FIG. 14 and the device of FIG. 15 can be fabricated according to the above methods. The embodiment shown in FIG. 14 may be preferred for use when it is desirable that there be a larger separation between the N-well and the deep sub-collector. In contrast, the embodiment shown in FIG. 15 may be preferred when it is desirable that carrier flow into the first epi region be minimized, because in that embodiment, the recombination time is shorter. In both the embodiments shown in FIGS. 14 and 15, the deep sub-collector eliminates injection into the substrate.

While the invention has been described with reference to exemplary embodiments, it is understood that the words, which have been used herein, are words of description and illustration, rather than words of limitation. Changes may be made, within the purview of the appended claims, without departing from the scope and spirit of the present invention in its aspects. Thus, although the invention has been described herein with reference to particular materials and embodiments, the invention is not intended to be limited to the particulars disclosed herein; rather, the invention extends to all functionally equivalent structures, methods and uses, such as are within the scope of the appended claims.

What is claimed is:

1. A structure comprising:
    a deep sub-collector located in a first epitaxial layer;
    a near sub-collector located in a second epitaxial layer;
    a deep trench isolation structure isolating a region which is substantially above the deep sub-collector;
    a reach-through structure in contact with the near sub-collector; and
    a reach-through structure in contact with the deep sub-collector to provide a low-resistance shunt, which prevents latch-up of a device.

2. The structure of claim 1, wherein a P-well region is formed in the first epitaxial layer above the deep sub-collector, and the P-well region is isolated by the deep sub-collector and the reach-through structure in contact with the deep sub-collector.

3. The structure of claim 1, wherein the reach-through structure in contact with the deep sub-collector extends through a P− region formed in the first epitaxial layer.

4. The structure of claim 3, wherein the deep trench isolation structure forms a three-dimensional ring around the P-well.

5. The structure of claim 1, wherein the near sub-collector is in the region substantially above the deep sub-collector.

6. The structure of claim 5, wherein the near sub-collector is located under a device in a complimentary metal oxide semiconductor portion of the structure.

7. The structure of claim 5, wherein the near sub-collector is formed substantially in parallel with the deep sub-collector within a complimentary metal oxide semiconductor portion of the structure to form parallel sub-collector low-resistance paths underneath the structure.

8. The structure of claim 1, wherein the near sub-collector is in a region substantially outside the region above the deep sub-collector.

9. The structure of claim 1, wherein the reach-through structure in contact with the deer sub-collector is a stacked structure extending through at least two epitaxial layers to the deep sub-collector.

10. The structure of claim 1, wherein the second epitaxial layer is arranged above the first epitaxial layer.

11. The structure of claim 1, wherein the second epitaxial layer is arranged above the first epitaxial layer and above the deep sub-collector.

12. The structure of claim 1, wherein the deep sub-collector and the near sub-collector each have a doping concentration of between $1 \times 10^{18}$ atoms/cm$^3$ and $1 \times 10^{21}$ atoms/cm$^3$.

13. A multi-circuit structure, comprising:
 a deep sub-collector formed in a first region under a first device;
 a near sub-collector formed in a second region under a second device, the near sub-collector being located closer to the second device than the deep-sub-collector is to the first device;
 at least one low-resistance path electrically connecting the first device and the deep sub-collector; and
 a deep trench isolation structure isolating a region substantially above the deep sub-collector.

14. The structure of claim 13, wherein the deep sub-collector is buried under at least one epitaxial layer.

15. The structure of claim 13, wherein the first device is a complementary metal oxide semiconductor device.

16. The structure of claim 13, wherein the at least one low-resistance path is a reach-through structure providing a lateral or vertical low-resistance path.

17. The structure of claim 16, wherein the at least one reach-through extends on sides of the first device and is configured to prevent latch-up conditions.

18. The structure of claim 16, wherein the at least one reach-through is a stacked structure formed from a second reach-through stacked on a first reach-through.

19. The structure of claim 16, wherein the at least one reachthrough extends at least partially through at least two epitaxial layers to the deep sub-collector.

20. The structure of claim 19, further comprising shallow isolation regions formed in the second epitaxial layer, the at least one reach-through contacting at least one of the shallow isolation regions.

21. The structure of claim 13, wherein the deep trench isolation structure forms a three-dimensional ring which isolates the first device.

22. The structure of claim 13, wherein the deep sub-collector is located in a first epitaxial layer, the near sub-collector is located in a second epitaxial layer, and the second epitaxial layer is arranged above the first epitaxial layer.

23. The structure of claim 13, wherein the deep sub-collector is located in a first epitaxial layer, the near sub-collector is located in a second epitaxial layer, and the second epitaxial layer is arranged above the first epitaxial layer and above the deep sub-collector.

24. The structure of claim 13, wherein the deep sub-collector and the near sub-collector each have a doping concentration of between $1 \times 10^{18}$ atoms/cm$^3$ and $1 \times 10^{21}$ atoms/cm$^3$.

\* \* \* \* \*